(12) United States Patent
Yano et al.

(10) Patent No.: US 8,821,226 B2
(45) Date of Patent: Sep. 2, 2014

(54) VENT MEMBER

(75) Inventors: Youzou Yano, Osaka (JP); Yuuta Shimazaki, Osaka (JP); Toshimasa Nishimori, Osaka (JP); Yuuki Sugou, Osaka (JP); Yoshiki Ikeyama, Osaka (JP)

(73) Assignee: Nitto Denko Corporation, Osaka (JP)

( * ) Notice: Subject to any disclaimer, the term of this patent is extended or adjusted under 35 U.S.C. 154(b) by 1620 days.

(21) Appl. No.: 12/084,929

(22) PCT Filed: Nov. 15, 2006

(86) PCT No.: PCT/JP2006/322748
§ 371 (c)(1),
(2), (4) Date: Oct. 2, 2008

(87) PCT Pub. No.: WO2007/058206
PCT Pub. Date: May 24, 2007

(65) Prior Publication Data
US 2009/0047890 A1   Feb. 19, 2009

(30) Foreign Application Priority Data
Nov. 17, 2005 (JP) ................. 2005-333394

(51) Int. Cl.
| B60H 1/24 | (2006.01) |
| F21V 31/03 | (2006.01) |
| H05K 5/02 | (2006.01) |
| F21S 8/10 | (2006.01) |
| B65D 77/22 | (2006.01) |

(52) U.S. Cl.
CPC ............ B65D 77/225 (2013.01); H05K 5/0213 (2013.01); F21S 48/332 (2013.01); H02K 2205/09 (2013.01); F21S 48/337 (2013.01); F21V 31/03 (2013.01); F21S 48/335 (2013.01)
USPC ............................. 454/143; 454/162; 454/275

(58) Field of Classification Search
CPC ...... F21S 48/332; F21V 31/03; B65D 77/225; H05K 5/0213
USPC .................. 454/143, 270, 275, 338, 370, 162; 55/385.1–385.5
See application file for complete search history.

(56) References Cited

U.S. PATENT DOCUMENTS 4,466,553 A * 8/1984 Zenger ..................... 220/495.08
4,516,974 A * 5/1985 Davis ............................ 604/333

(Continued)

FOREIGN PATENT DOCUMENTS

EP 0 377 067 A1 7/1990
EP 1 202 616 A1 5/2002

(Continued)

Primary Examiner — Steven B McAllister
Assistant Examiner — Frances H Kamps
(74) Attorney, Agent, or Firm — Hamre, Schumann, Mueller & Larson, P.C.

(57) ABSTRACT

A vent member (1) includes a support body (2) provided with a through-hole (3), a permeable membrane (6) closing the through-hole (3) in the support body (2), and a cover part (10) covering the permeable membrane (6). A ventilation hole (10a) is made in a ceiling portion (11) of the cover part (10) and a notch (10b) is made in a side wall portion (12) thereof. These ventilation hole (10a) and notch (10b) function as a passage for ventilation between the interior and the exterior of the cover part (10). The ventilation hole (10a) establishes a positional relation that it does not overlap a permeable region of the permeable membrane (6) in the axial direction. Further, the side wall portion (12) extends to the lower side in the axial direction below a position at which the permeable membrane (6) is disposed, and the permeable membrane (6) is protected entirely along a circumferential direction by the side wall portion (12). The permeable membrane (6) is disposed on a mesa-like portion (14) that is convex to the upper side in the axial direction.

6 Claims, 13 Drawing Sheets

(56) References Cited

U.S. PATENT DOCUMENTS

| | | | |
|---|---|---|---|
| 5,209,992 A * | 5/1993 | Feres | 429/86 |
| 5,914,415 A * | 6/1999 | Tago | 55/385.4 |
| 6,364,924 B1 | 4/2002 | Mashiko et al. | |
| 6,524,361 B1 * | 2/2003 | Thornton et al. | 55/385.4 |
| 6,994,621 B2 * | 2/2006 | Mashiko et al. | 454/270 |
| 7,166,024 B2 * | 1/2007 | Mashiko et al. | 454/370 |
| 7,357,709 B2 * | 4/2008 | Zukor et al. | 454/270 |
| 8,246,726 B2 * | 8/2012 | Yano | 96/4 |
| 2002/0090506 A1 * | 7/2002 | Protzner et al. | 428/334 |
| 2003/0216119 A1 | 11/2003 | Mashiko et al. | |
| 2009/0109618 A1 * | 4/2009 | Yano | 361/694 |
| 2010/0227544 A1 * | 9/2010 | Furuyama et al. | 454/339 |

FOREIGN PATENT DOCUMENTS

| | | |
|---|---|---|
| JP | 63-197861 U | 12/1988 |
| JP | 6-31130 A | 2/1994 |
| JP | 10-85536 A | 4/1998 |
| JP | 2001-143524 A | 5/2001 |
| JP | 2003-318557 A | 11/2003 |
| JP | 2003-336874 A | 11/2003 |
| JP | 2004-47425 A | 2/2004 |

* cited by examiner

VENT MEMBER

TECHNICAL FIELD

The present invention relates to a vent member attached to a housing.

BACKGROUND ART

Vent members are attached to housings that accommodate therein electrical components of an automobile, such as lamps, sensors, and ECUs, in order not only to ensure ventilation between the interior and the exterior of the housings but also to prevent the entry of foreign matter into the interior of the housings. Examples of such vent members are disclosed in JP 2004-47425A, JP 10-85536A, and JP 2001-143524A.

For instance, as is shown in FIG. 14, the vent member disclosed in JP 2004-47425A includes a support body 103 on which a permeable membrane 102 is disposed and a cover part 104 attached to the support body 103 so as to cover the permeable membrane 102. The vent member 101 configured as above is fixed to an opening 107 of a housing 106 via an O-ring 105. By allowing a gas to permeate through the permeable membrane 102, it is possible to ensure ventilation between the interior and the exterior of the housing 106. The cover part 104 prevents damage to the permeable membrane 102 caused by an external force and deterioration to the permeability of the permeable member 102 caused by deposition of dust.

In recent years, there has been a need for vent members that are more excellent in durability against foreign matter. For example, as vent members to be used for the housings of lamps and ECUs in an automobile, there is a need for vent members not only capable of withstanding car washing, in particular, high-pressure car washing, but also capable of completely preventing the entry of water into the interior of the housings.

Regarding the vent member 101 shown in FIG. 14, because the cover part 104 covers the permeable membrane 102 directly above, it stands strong against foreign matter, such as water droplets falling down from directly above. However, because it opens widely in the lateral direction, it is highly likely that foreign matter coming from the side applies a direct impact to the permeable membrane 102. In addition, once the foreign matter adheres onto the permeable membrane 102, it remains on the permeable membrane 102 and can cause deterioration of the permeability.

Meanwhile, the vent members disclosed in JP 10-85536A and JP 2001-143524A are configured in such a manner that the permeable membrane is covered completely with a tubular cover part. It is therefore less likely that foreign matter, such as water droplets, applies a direct impact to the permeable membrane. However, the configuration that resists the entry of foreign matter into the interior of the cover part can bring out an adverse effect in some cases. More specifically, once the foreign matter enters the interior of the cover part, the foreign matter will not be readily discharged to the exterior of the cover part or it frequently remains on the permeable membrane and on the inner surface of the cover part.

In addition, the vent members disclosed in JP 10-85536A and JP 2001-143524A fail to achieve sufficient dust-proof and water-proof effects unless they are used in a posture in which the cover part is oriented vertically upward. When used in a posture in which the cover part is oriented vertically downward, foreign matter can enter the interior of the cover part with relative ease. In short, the vent members disclosed in JP 10-85536A and JP 2001-143524A have limitations of use that are absent with the vent member shown in FIG. 14.

DISCLOSURE OF THE INVENTION

The invention has an object to provide a vent member configured in such a manner that the permeable membrane is least susceptible to a direct impact of foreign matter, such as water droplets coming from all directions, and the foreign matter hardly remains in the interior regardless of loose limitations of use.

That is, one aspect of the invention provides a vent member to be attached to a housing that needs ventilation. The vent member includes a support body having a through-hole to serve as a passage for ventilation between an interior and an exterior of the housing, a permeable membrane disposed on the support body so as to close one of the openings of the through-hole, and a cover part covering the support body from a side where the permeable membrane is disposed. Assuming that a direction parallel to a thickness direction of the permeable membrane is an axial direction and an exterior side of the housing and an interior side of the housing with respect to the axial direction are an upper side and a lower side, respectively, then the support body includes a mesa-like portion that is convex to the upper side in the axial direction and the through-hole opens in the mesa-like portion for the permeable membrane disposed thereon. Also, the cover part includes a ceiling portion facing the permeable membrane and a side wall portion extending from a periphery of the ceiling portion to the lower side in the axial direction. The ceiling portion is provided with a ventilation hole that brings an interior and an exterior of the cover part into communication with each other while establishing a positional relationship in which the ventilation hole does not overlap a permeable region of the permeable membrane with respect to the axial direction. The side wall portion extends to the lower side in the axial direction below a position at which the permeable membrane is disposed, so that a clearance bringing the interior and the exterior of the cover part into communication with each other is secured between the side wall portion and the support body. The permeable membrane is protected entirely along a circumferential direction by the side wall portion.

According to the vent member of the invention, the ventilation hole is made in the ceiling portion of the cover part that protects the permeable membrane. The ventilation hole makes ventilation between the interior and the exterior of the cover part satisfactory. Also, the ventilation hole has a positional relationship in which it does not overlap a permeable region of the permeable membrane in the axial direction. Hence, should foreign matter, such as water droplets coming from the upper side in the axial direction, enter the interior of the cover part through the ventilation hole, the foreign matter is least likely to impinge directly on the permeable membrane. Moreover, by disposing the permeable membrane on the mesa-like portion that is convex to the upper side in the axial direction, it is possible to achieve the configuration that makes it easier to eliminate the foreign matter from the permeable membrane.

Further, the side wall portion of the cover part protects the permeable membrane entirely along the circumferential direction by extending to the lower side in the axial direction below the position at which the permeable membrane is disposed. Accordingly, as long as a direction is perpendicular to the axial direction (in-plane direction), the permeable membrane is protected in a reliable manner from foreign matter coming from any direction. In addition, a clearance is secured between the side wall portion of the cover part and the support body. To be more specific, it is possible efficiently to discharge water having entered the interior of the cover part through the ventilation hole made in the ceiling portion to the exterior of the cover part through the clearance between the side wall portion of the cover part and the support body. Conversely, it is possible efficiently to discharge water having entered the interior of the cover part through the clearance between the side wall portion of the cover part and the support body to the exterior of the cover part through the ventilation hole made in the ceiling portion of the cover part. In other words, according to the vent member of the invention, in any of the following cases: (i) where the vent member is used in a posture in which the ceiling portion of the cover part is oriented vertically upward; (ii) where the vent member is used in a posture in which the ceiling portion of the cover part is oriented vertically downward; and (iii) where the vent member is used in a posture in which the ceiling portion of the cover part is oriented horizontally, it is possible to achieve the action to discharge water having entered the interior of the cover part to the exterior of the cover part at the same level of efficacy. The limitations of use are therefore relaxed.

As has been described, according to the invention, it is possible to provide a vent member configured in such a manner that the permeable membrane is least susceptible to a direct impact of foreign matter, such as water droplets coming from all directions, and the foreign matter hardly remains in the interior regardless of relaxed limitations of use.

BEST MODE FOR CARRYING OUT THE INVENTION

Hereinafter, embodiments of the invention will be described with reference to the accompanying drawings.

Figure 1:
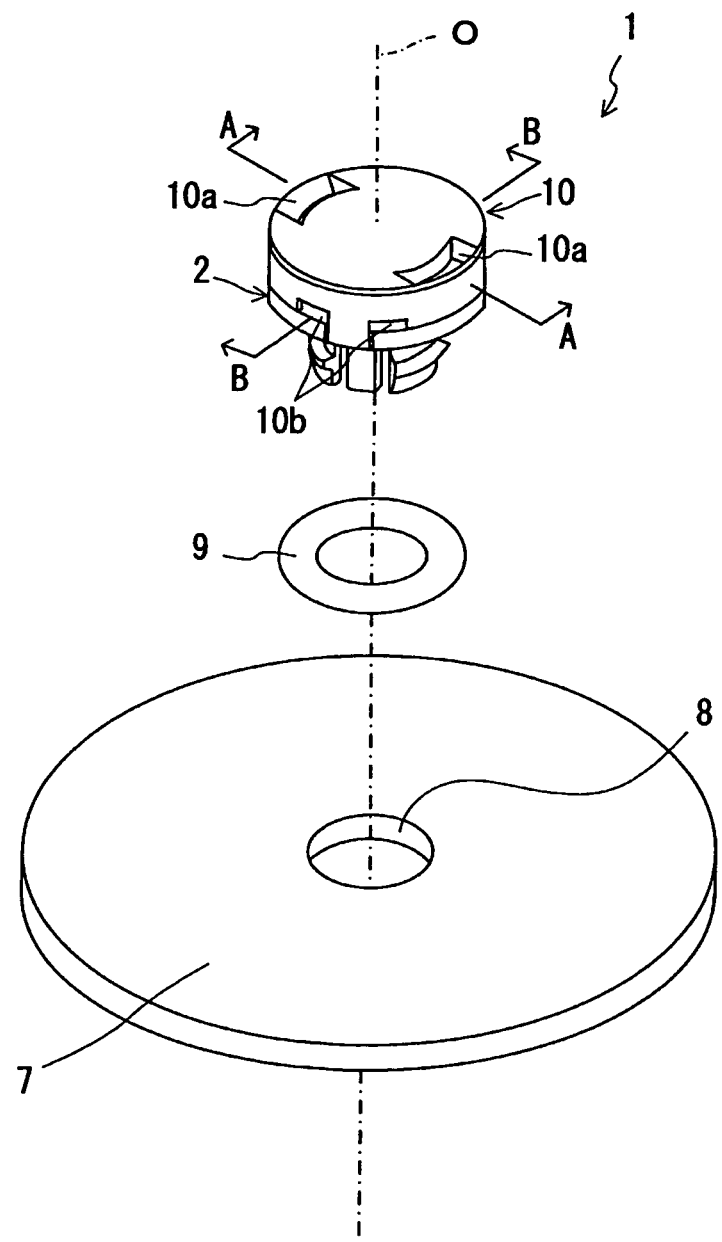
FIG. 1 is a perspective view of a vent member according to a first embodiment.
Figure 2:
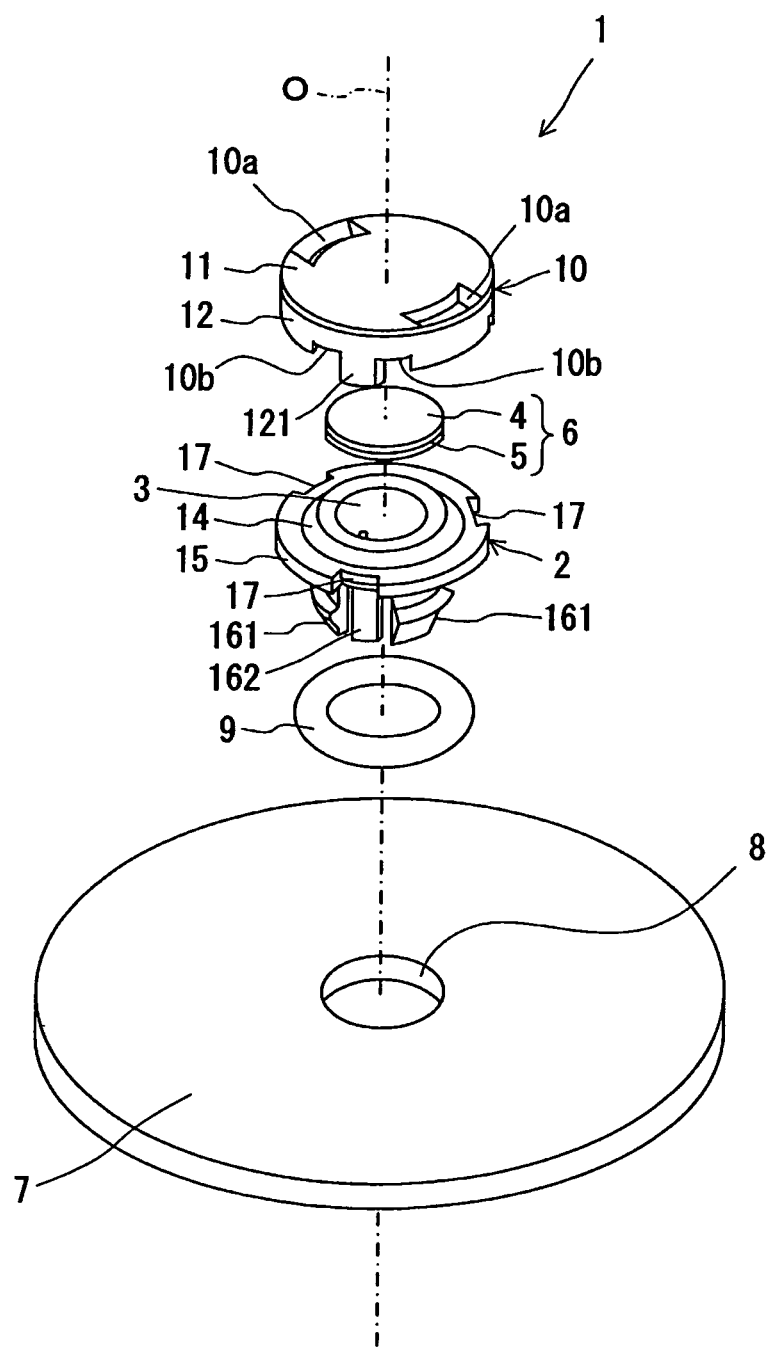
FIG. 2 is an exploded perspective view of the vent member shown in FIG. 1.
Figure 3:
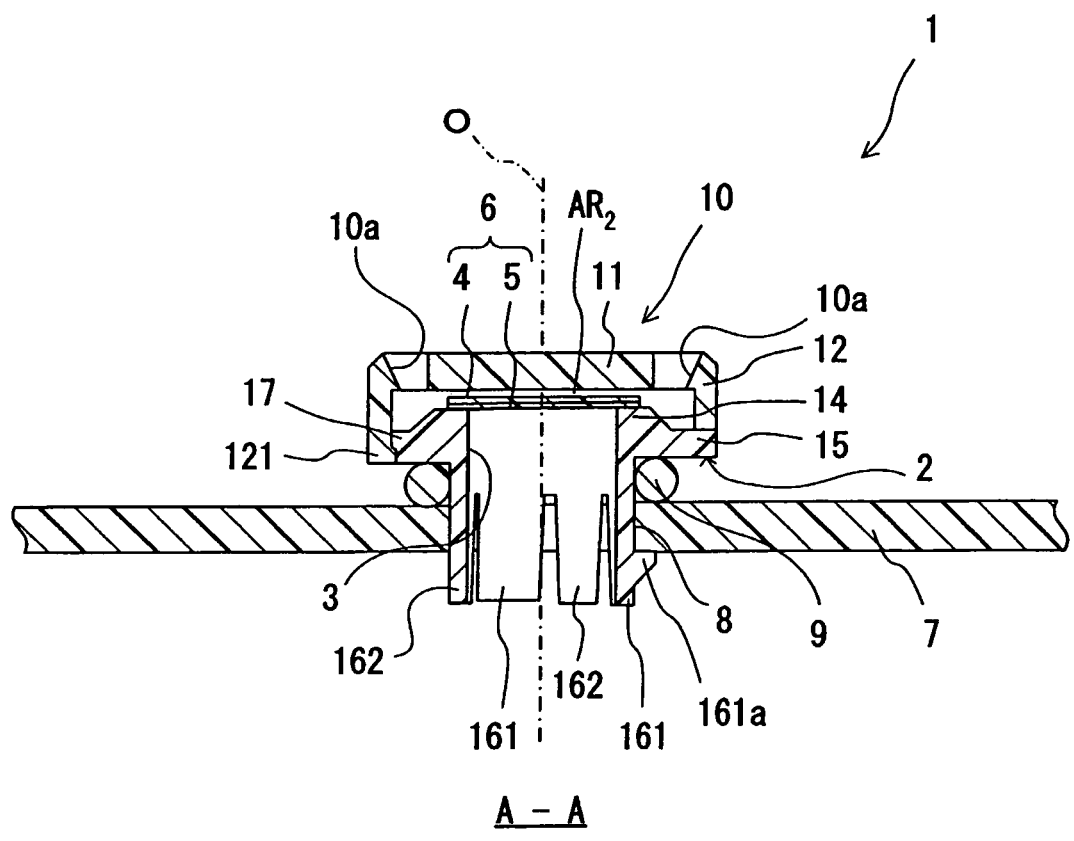
FIG. 3 is a cross section of the vent member taken on line A-A of FIG. 1.
Figure 4:
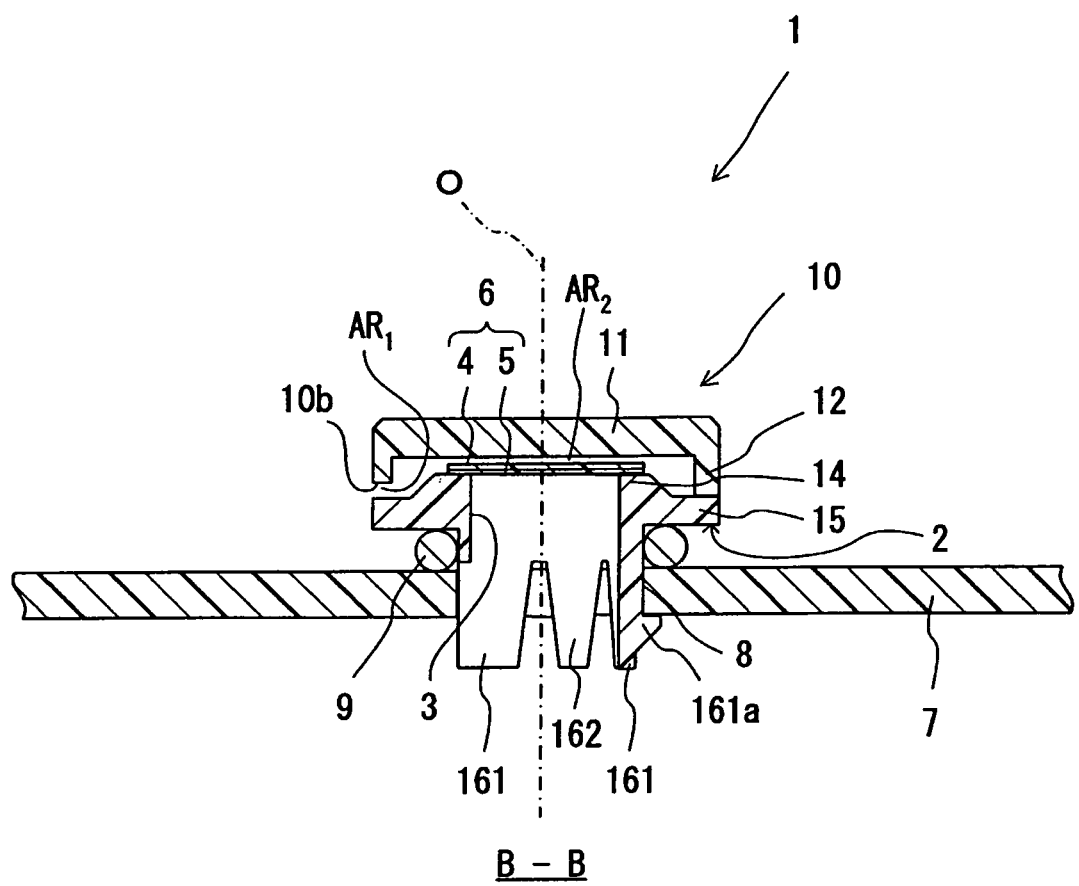
FIG. 4 is a cross section of the vent member taken on line B-B of FIG. 1.
Figure 13:
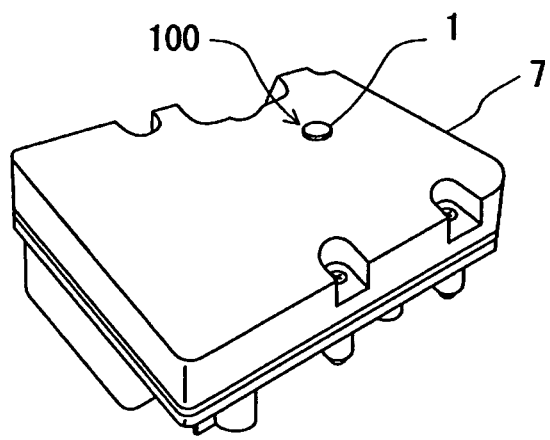
FIG. 13 is an overall view of a housing to which the vent member is attached.
Figure 14:
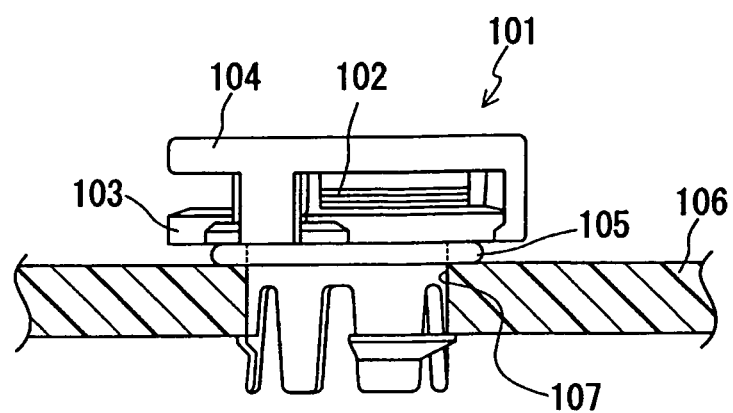
FIG. 14 is a side view of a vent member in the related art.

FIG. 1 is a perspective view of a vent member according to a first embodiment of the invention. FIG. 2 is an exploded perspective view of the vent member shown in FIG. 1. FIG. 3 is a cross section of the vent member taken on line A-A of FIG. 1. FIG. 4 is a cross section of the vent member taken on line B-B of FIG. 1. FIG. 13 is an overall view of a housing to which the vent member of FIG. 1 is attached. As is shown in FIG. 13, the vent member 1 shown in FIG. 1 through FIG. 4 is attached, for example, to the opening of a housing 7 of an electrical component of an automobile, and forms a ventilation structure 100 to enable ventilation between the interior and the exterior of the housing 7.

As are shown in FIG. 1 through FIG. 4, the vent member 1 includes a support body 2 having a through-hole 3 to serve as a passage for ventilation between the interior and the exterior of the housing 7, a permeable membrane 6 disposed on the support body 2 so as to close one of the openings of the through-hole 3, and a cover part 10 covering the support body 2 from the side where the permeable membrane 6 is disposed. One of the openings of the through-hole 3 made in the support body 2 is closed with the permeable membrane 6 and the other opening is exposed to the interior of the housing 7. The permeable membrane 6 is capable of preventing the entry of foreign matter, such as water droplets and dust, into the interior of the housing 7 while allowing permeation of a gas. The internal pressure of the housing 7 is maintained equal to the external pressure by the gas permeation action of the permeable membrane 6.

The cover part 10 is provided with ventilation holes 10a that bring the interior and the exterior of the cover part 10 into communication with each other. Further, notches 10b made in a side wall portion 12 of the cover part 10 define a clearance between the cover part 10 and the support body 2. A liquid and a gas are allowed to circulate between the interior and the exterior of the cover part 10 through these ventilation holes 10a and notches 10b. Because the ventilation holes 10a are made at positions sufficiently distant from the center axis line O, foreign matter having entered through the ventilation holes 10a hardly adheres directly onto the permeable membrane 6. Also, because the support body 2 to which the permeable membrane 6 is fixed has a shape of a mesa, foreign matter having entered through the notches 10b of the cover part 10 hardly adheres directly onto the permeable membrane 6. The structure described as above makes it possible to prevent the foreign matter from adhering onto the permeable membrane 6 while ensuring satisfactory ventilation between the interior and the exterior of the cover part 10. In addition, by shaping the support body 2 like a mesa and providing the cover part 10 with the ventilation holes 10a and the notches 10b, the foreign matter (in particular, water) having entered the interior of the cover part 10 is discharged smoothly to the exterior of the cover part 10.

Hereinafter, the individual parts will be described and the relations among the parts will be described in detail. Herein, a direction parallel to the thickness direction of the permeable membrane 6 is defined as the axial direction and a direction perpendicular to the axial direction is defined as the in-plane direction. In other words, the axial direction is a direction parallel to the center axis line O of the through-hole 3. Also, with respect to the axial direction, the side oriented toward the exterior of the housing 7 (the side where the opening closed with the permeable membrane 6 is positioned) is defined as the upper side and the side oriented toward the interior of the housing 7 (the side where the opening connected to the housing 7 is positioned) is defined as the lower side.

Support Body 2

As are shown in FIG. 2 through FIG. 4, the support body 2 is formed of a mesa-like portion 14, a base portion 15 adjacent to the mesa-like portion 14 on the lower side thereof, and leg portions 161 and 162. Of the support body 2, the mesa-like portion 14 is a portion in a shape that is convex to the upper side in the axial direction. The through-hole 3 opens in the mesa-like portion 14 for the permeable membrane 6 disposed thereon. Of the support body 2, the base portion 15 forms a portion that continues to the lower side of the mesa-like portion 14 and is of a ring shape (or a tubular shape) having a larger diameter than the mesa-like portion 14. As is shown in a partially enlarged view in FIG. 7, the top face 14*p* (upper surface) of the mesa-like portion 14 on which the permeable membrane 6 is disposed is positioned on the upper side in the axial direction above the outer periphery of the base portion 15. The mesa-like portion 14 has the top face 14*p* that is parallel to the in-plane direction and a side face 14*q* that continues to the top face 14*p*. The side face 14*q* inclines with respect to both the axial direction and the top face 14*p*. In other words, the mesa-like portion 14 is of a shape whose outside diameter gradually is reduced in the direction of the upper side in the axial direction. The mesa-like portion 14, however, may be of a shape in which the side face 14*q* becomes parallel to the axial direction, that is, a shape whose outside diameter is reduced step-wise.

The base portion 15 is provided with support body side engagement portions 17 used to fix the cover part 10. The support body side engagement portions 17 are portions used to fix the cover part 10, and provided at three points (plural points) along the circumferential direction of the base portion 15 to enclose the permeable membrane 6 at equiangular intervals (predetermined intervals). In this embodiment, notches that are concave toward the center axis line O are made in the base portion 15 and used as the support body side engagement portions 17.

The leg portions 161 and 162 are portions that continue to the base portion 15 on the side opposite to the mesa-like portion 14 and extend to the lower side in the axial direction. By inserting these leg portions 161 and 162 into the opening 8 of the housing 7, it is possible to fix the support body 2 to the housing 7. Also, the leg portions 161 and 162 are divided into six parts along the circumferential direction. Of the six leg portions 161 and 162, three leg portions 161 have fixing portions 161*a*. The fixing portions 161*a* are portions that are convex outward in the radial direction. The leg portions 161 having the fixing portions 161*a* and the leg portions 162 having no fixing portions 161*a* are arranged alternately.

When the vent member 1 is to be attached to the opening 8 of the housing 7, a seal ring 9 that surrounds the leg portions 161 and 162 is disposed on the lower side of the base portion 15. The seal ring 9 is an elastic part made of elastomers, such as NBR (nitrile rubber), EPDM (ethylene-propylene rubber), silicone rubber, fluorocarbon rubber, acrylic rubber, and nitrile hydride rubber, foams, or foams with adhesive layer. By pushing the leg portions 161 and 162 forcefully into the opening 8 of the housing 7, the support body 2 is pushed in a direction away from the opening 8 of the housing 7 by an elastic restoring force of the seal ring 9 sandwiched between the base portion 15 and the housing 7. In this instance, the fixing portions 161*a* exposed to the interior of the housing 7 play a role of returns and prevent the leg portions 161 and 162 from falling off from the opening 8 of the housing 7. The vent member 1 consequently is fixed to the housing 7. Alternatively, it may be configured in such a manner that the vent member is fixed to the housing 7 by inserting (screwing) threading leg portions into the opening 8 of the housing 7.

The support body 2 described as above can be manufactured using typical molding methods, such as injection molding, compression molding, and cutting, by making the base portion 15, the mesa-like portion 14, and the leg portions 161 and 162 into one piece. From the viewpoint of moldability, it is preferable to use thermoplastic resin as a material of the support body 2. To be more concrete, thermoplastic resins, such as PBT (polybutylene terephthalate), PA (nylon), and PET (polyethylene terephthalate), and thermoplastic elastomers, such as EPDM (ethylene propylene diene rubber) and silicone rubber, are available. Materials of the support body 2 may contain pigments, such as carbon black and titanium white, reinforcing fillers, such as glass particles and glass fibers, and water-repellent materials. In addition, applying a liquid-repellent treatment on the surface of the support body 2 makes it easier to eliminate a liquid (water or oil) having entered the interior of the cover part 10. Other treatments, such as easy-adhesion treatment, insulating treatment, semiconductor treatment, and conducting treatment, may be applied to the support body 2.

Permeable Membrane 6

A structure and a material of the permeable membrane 6 are not particularly limited as long as it is a membrane that allows permeation of a gas and inhibits permeation of a liquid. In this embodiment, the permeable membrane 6 formed by laminating a resin porous membrane 4 and a reinforcing layer 5 is shown as an example. By providing the reinforcing layer 5, it is possible to form the permeable membrane 6 with high strength. As a material of the resin porous membrane 4, it is possible to use a fluorocarbon resin porous material or a polyolefin porous material, which can be manufactured by a known drawing method or extracting method. Examples of fluorocarbon resin include but not limited to polytetrafluoroethylene (PTFE), polychlorotrifluoroethylene, a copolymer of tetrafluoroethylene and hexafluoropropylene, and a copolymer of tetrafluoroethylene and ethylene. Examples of monomers forming polyolefin include but not limited to ethylene, propylene, and 4-methylpentene-1,1 butene. It is possible to use polyolefin obtained by polymerizing these monomers alone or copolymerizing these monomers. In addition, a nanofiber film porous material using polyacrylnitrile, nylon, polylactate, and so forth can be used as well. It is preferable to use, in particular, a PTFE porous material furnished with a high function of preventing the entry of foreign matter into the interior of the housing while ensuring ventilation with a small area.

Liquid-repellent treatment may be applied to the resin porous membrane 4 depending on the use of the housing. The liquid-repellent treatment can be applied by coating the resin porous membrane 4 with a substance having small surface tension and letting it dry followed by curing. It is sufficient for a liquid-repellent agent used in the liquid-repellent treatment to form a coating film with surface tension lower than that of the resin porous membrane 4. For example, a liquid-repellent agent including polymers having perfluoroalkyl groups is suitable. The coating of the liquid-repellent agent can be performed by means of impregnation, spraying, and so forth. Also, from the viewpoint of ensuring a sufficient water-proof capability, it is preferable that an average pore diameter of the resin porous membrane 4 is in a range of 0.01 μm to 10 μm, both inclusive.

It is preferable that a material of the reinforcing layer 5 is more permeable than the resin porous membrane 4. To be more concrete, a fabric, a nonwoven fabric, a mesh, a net, a sponge, a foam, and a porous material made of resin or metal are available. A method for joining the resin porous membrane 4 and the reinforcing layer 5 can be a bonding method by means of adhesive laminate, heat laminate, heat welding, or ultrasonic welding, or with the use of an adhesive.

By taking the strength and ease of fixing to the support body 2 into account, the thickness of the permeable membrane 6 can be adjusted, for example, in a range of 1 μm to 5 mm. It is preferable that the permeability of the resin porous membrane 4 or the permeable membrane 6 in Gurley value is 0.1 to 300 sec/100 cm³. In this embodiment, the permeable membrane 6 is fixed to the support body 2 by means of thermal welding. However, the permeable membrane 6 can be fixed to the support body 2 by other methods, for example, by means of ultrasonic welding or with the use of an adhesive.

Cover Part 10

As are shown in FIG. 2 through FIG. 4, the cover part 10 is formed of a ceiling portion 11 and a side wall portion 12. Such a cover part 10 can be manufactured from the same material as the material of the support body 2 by making the ceiling portion 11 and the side wall portion 12 into one piece by a known injection molding method. The ceiling portion 11 is almost of a disc shape and provided with the ventilation holes 10a and 10a at two points in the outer peripheral portion. The number of the ventilation holes 10a is not particularly limited, and it is preferable to provide them at two to four points (plural points) along the circumferential direction at predetermined intervals. A part of the inner peripheral surface of the ventilation hole 10a forms an inclined surface that is inclined with respect to the axial direction and the in-plane direction in order to improve the water discharging capability.

The side wall portion 12 is of a tubular shape that extends to the lower side almost straight from the outer periphery of the ceiling portion 11. The side wall portion 12 of the cover part 10 includes cover side engagement portions 121 that engage with the support body side engagement portions 17 of the support body 2. Also, the notches 10b and 10b are formed adjacently to the cover side engagement portions 121 on either side. The notches 10b made in the side wall portion 12 at plural points (six points in this embodiment) along the circumferential direction define a clearance $AR_1$ that brings the interior and the exterior of the cover part 10 into communication with each other.

The cover side engagement portions 121 obtain moderate flexibility owing to the notches 10b and 10b formed adjacently on either side. When configured in this manner, not only can the cover part 10 be attached to the support body 2 with ease, but also the possibility of damaging the cover side engagement portions 121 at the time of attachment can be lowered. It should be noted, however, that the cover part may be fixed directly to the support body with the use of an adhesive or by means of ultrasonic welding by omitting the engagement portions 121 and 17.

Positional Relations Among Respective Parts

Each of the permeable membrane 6, the support body 2, and the cover part 10 is almost of a disc shape when viewed in a plane. As can be understood from the exploded perspective view in FIG. 2, in a state where the cover part 10 is attached to the support body 2 by engaging the cover side engagement portions 121 with the support body side engagement portions 17, the permeable membrane 6, the cover part 10, the support body 2, and the seal ring 9 are disposed concentrically about the common center axis line O. The support body 2 and the cover part 10 are adjusted to be of sizes in which the outlines appearing when projected in the axial direction almost coincide with each other. In short, the outside diameter of the support body 2 and the outside diameter of the cover part 10 are almost equal to each other. When configured in this manner, it is advantageous in reducing the vent member 1 in size.

For example, the vent member of a type disclosed in JP 2001-143524A is used in a state where it inserted into a tubular portion of the housing. The vent member therefore inevitably protrudes noticeably from the housing. Accordingly, a large attachment space is required. On the contrary, in the case of the vent member 1 of this embodiment, because only a hole has to be made in the housing 7, it is possible to achieve an extremely compact ventilation structure. Meanwhile, all the dust-proof and water-proof capabilities, the ventilation and the water discharging capability between the interior and the exterior of the cover part, and the attachment ease of to the housing are as good as or better than those of the conventional vent members.

Also, as are shown in FIG. 3 and FIG. 4, in a state where the cover part 10 is attached to the support body 2, a clearance $AR_2$ functioning as a passage for ventilation is defined between the ceiling portion 11 of the cover part 10 and the permeable membrane 6. Likewise, the clearance $AR_1$ functioning as a passage for ventilation is secured between the base portion 15 of the support body 2 and the side wall portion 12 of the cover part 10 on the basis of the notches 10b made in the side wall portion 12 of the cover part 10. A gas is allowed to flow in and out between the interior and the exterior of the housing 7 through these clearances $AR_1$ and $AR_2$.

Figure 5:
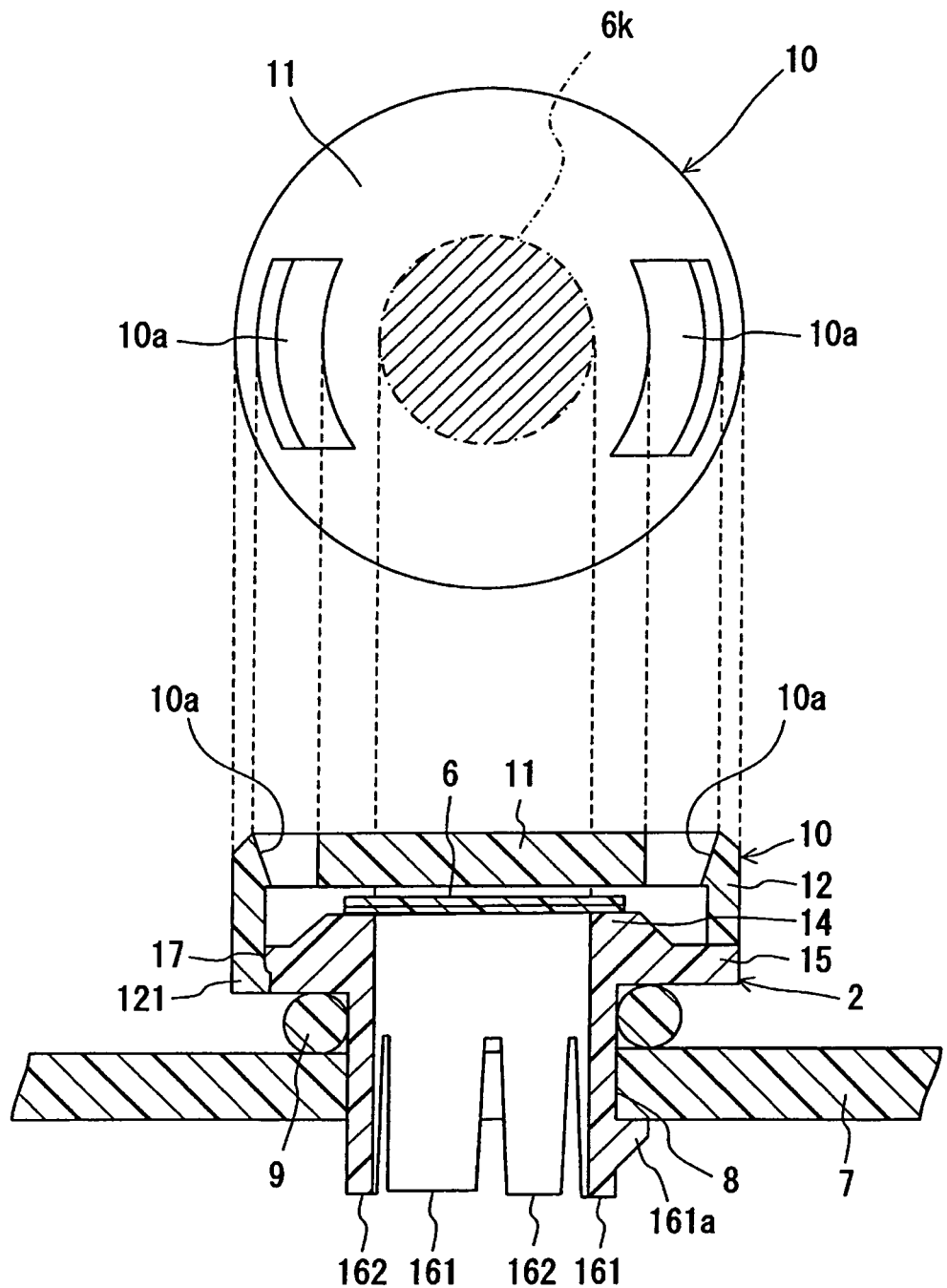
FIG. 5 is a view used to describe a positional relation of a permeable membrane and a cover part.

As is shown in FIG. 5, when a permeable region 6k of the permeable membrane 6 is projected onto the ceiling portion 11 of the cover part 10 in the axial direction, the projected plane of the permeable region 6k (the shaded portion in the drawing) does not overlap the ventilation holes 10a of the cover part 10. Each ventilation hole 10a has a positional relationship in which when the inner periphery thereof is extended straight in the axial direction, it crosses the side face 14q of the mesa-like portion 14. Also, it is configured in such a manner that the permeable membrane 6 is invisible from the upper side in the axial direction through the ventilation holes 10a. The positional relationship as described above makes it possible to prevent foreign matter from directly adhering onto the permeable region 6k of the permeable membrane 6 even in a case where foreign matter, such as water droplets coming from the axial direction, enters the interior of the cover part 10 through the ventilation holes 10a. More preferably, the top face 14p of the mesa-like portion 14 in which the permeable membrane 6 is disposed does not overlap the ventilation holes 10a in the axial direction.

Figure 7:
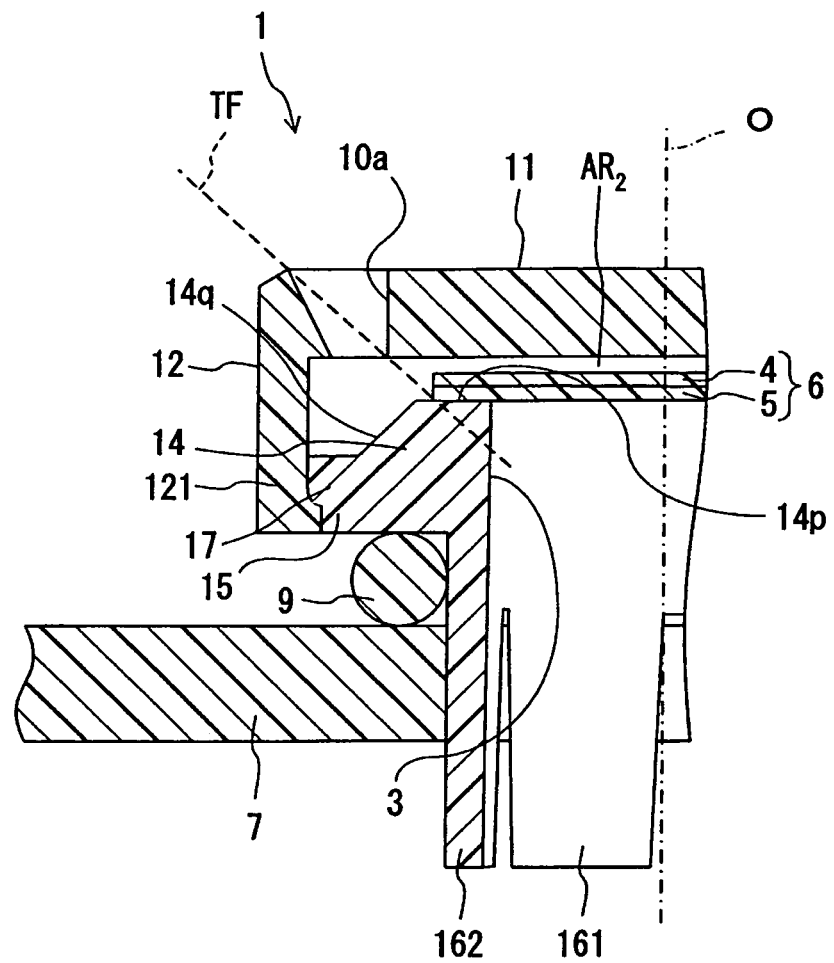
FIG. 7 is a partially enlarged view of FIG. 3.

Also, as is shown in the partially enlarged view in FIG. 7, in the cross section that is parallel to the axial direction and includes the center axis line O (that is, the cross section of FIG. 7), a straight line TF linking the bottom end of the ventilation hole 10a on the inner peripheral side and the top end on the outer peripheral side does not intersect the permeable region 6k of the permeable membrane 6. In other words, an arbitrary straight line passing through the permeable region 6k of the permeable membrane 6 inevitably passes through the cover part 10. By setting the positional relation of the ventilation holes 10a of the cover part 10 and the permeable membrane 6 as described above, it is possible to prevent foreign matter from adhering directly onto the permeable region 6k of the permeable membrane 6 even in a case where foreign matter coming from a diagonal direction enters the interior of the cover part 10 through the ventilation holes 10a.

Figure 6:
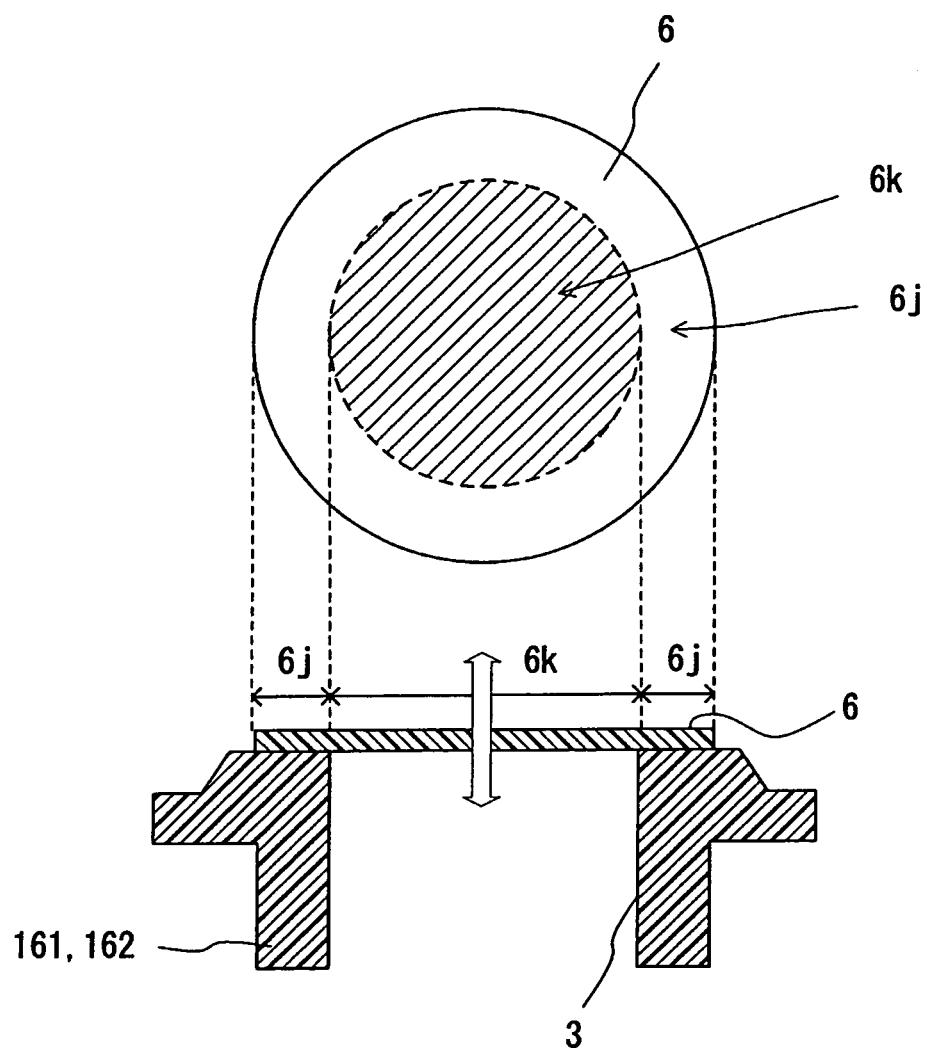
FIG. 6 is a schematic view used to describe a permeable region of the permeable membrane.

Herein, as is shown in the schematic view in FIG. 6, the permeable region 6k of the permeable membrane 6 means the region 6k in the permeable membrane 6 where a gas is actually allowed to permeate, that is, it is a region facing the through-hole 3 of the support body 2. The region 6j other than the permeable region 6k is a region supported on (fixed to) the mesa-like portion 14 of the support body 2.

As is shown in the cross section in FIG. 4 taken on line B-B, the side wall portion 12 of the cover part 10 protects the permeable membrane 6 entirely along the circumferential direction by extending to the lower side in the axial direction below the top face 14p of the mesa-like portion 14. Of the side wall portion 12, for the portion where neither the cover side engagements portions 121 nor the notches 10b and 10b are formed, the length in the axial direction is adjusted so that this portion almost comes into contact with the base portion 15 of the support body 2. When configured in this manner, it is possible to achieve concurrently both the ventilation and the water discharging capability between the interior and the exterior of the cover part 10 and the dust-proof and water-proof capabilities with respect to the in-plane direction. In the configuration in which the engagement portions 121 and 17 are omitted, a portion where no notches 10b are formed in the side wall portion 12 of the cover part 10 is joined directly to the base portion 15 of the support body 2.

Figure 8:
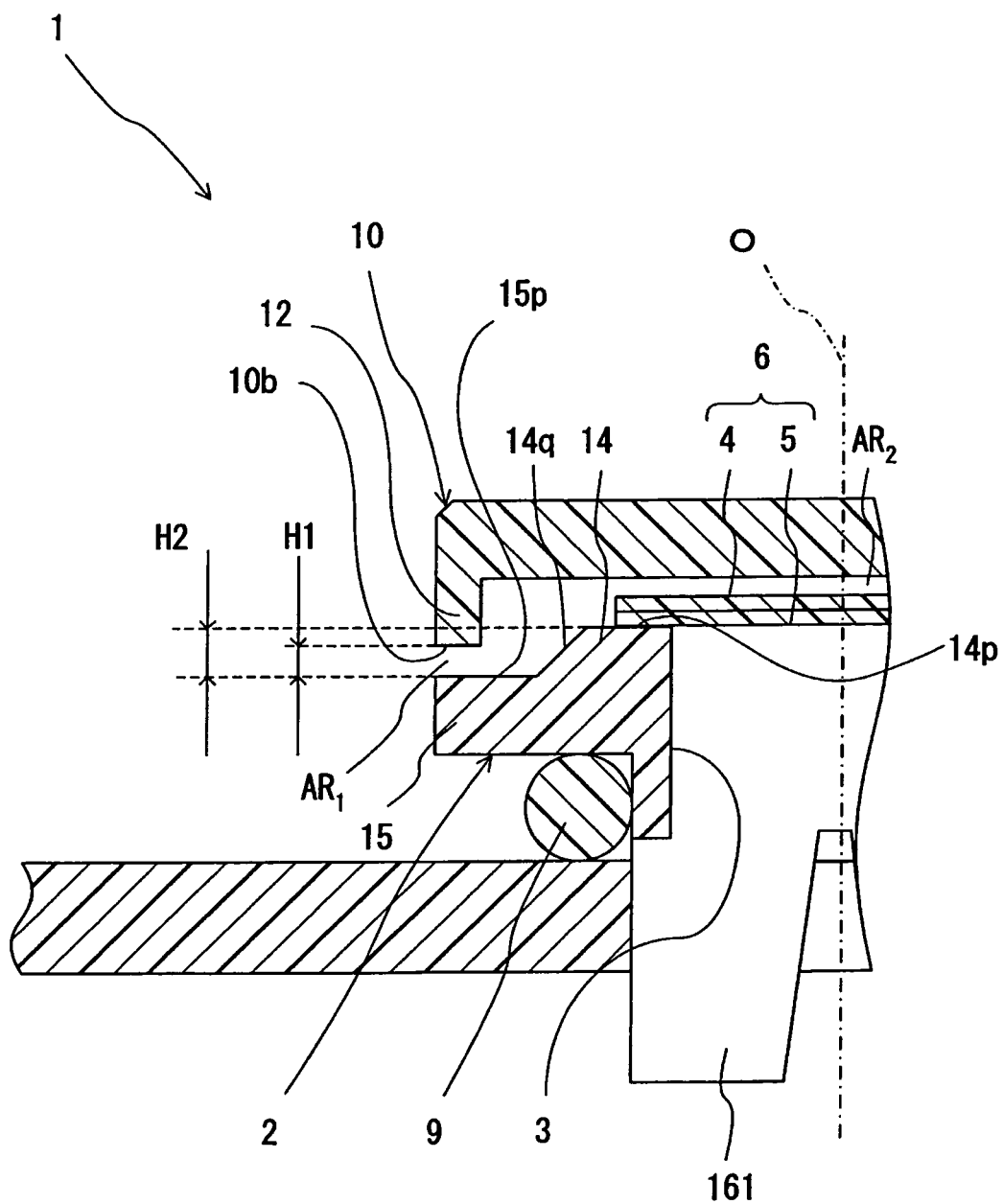
FIG. 8 is a partially enlarged view of FIG. 4.

Also, as is shown in FIG. 8, which is a partially enlarged view of FIG. 4, the notches 10b made in the side wall portion 12 of the cover part 10 define the clearance $AR_1$ to serve as a passage for ventilation between the cover part 10 and the base portion 15 of the support body 2. Let H1 be the height of the clearance $AR_1$ with respect to the axial direction, and let H2 be the height (protruding height) of the mesa-like portion 14 of the support body 2 with respect to the axial direction, then the inequality, H2>H1, is established in this embodiment. Hence, even in a case where foreign matter coming from the in-plane direction enters the interior of the cover part 10 through the notches 10b, the foreign matter is blocked by the mesa-like portion 14 and therefore will not adhere directly onto the permeable membrane 6.

Figure 9:
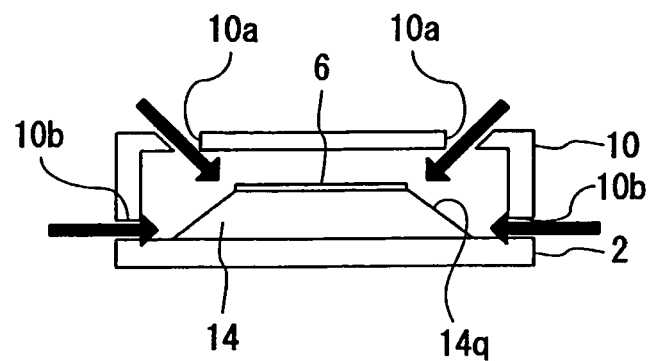
FIG. 9 is a view used to describe an action of the vent member of the first embodiment.
Figure 10A:
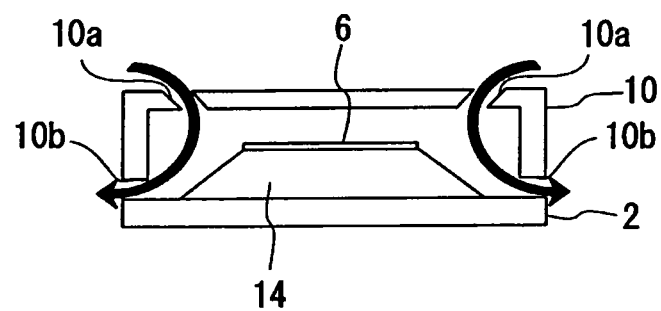
FIG. 10A is a view used to describe the action in relation to FIG. 9.

Also, as is shown in the schematic view in FIG. 9, according to the vent member 1 of this embodiment, even in a case where water (indicated by arrows in the drawing) enters the interior of the cover part 10 through the ventilation holes 10a and the notches 10b, water does not impinge directly on the permeable membrane 6, and instead, it impinges on the side face 14q of the mesa-like portion 14. As is shown in FIG. 10A, in a case where the vent member 1 is used in a posture in which the cover part 10 is oriented vertically upward, water having entered the interior of the cover part 10 flows down on the side face 14q of the mesa-like portion 14 and thereby is discharged quickly to the exterior of the cover part 10 through the notches 10b. The mesa-like portion 14 can achieve a satisfactory water discharging capability by adjusting the angle of inclination of the side face 14q with respect to the top face 14p to a suitable angle (for example, in a range of 30° to 90°).

Figure 10B:
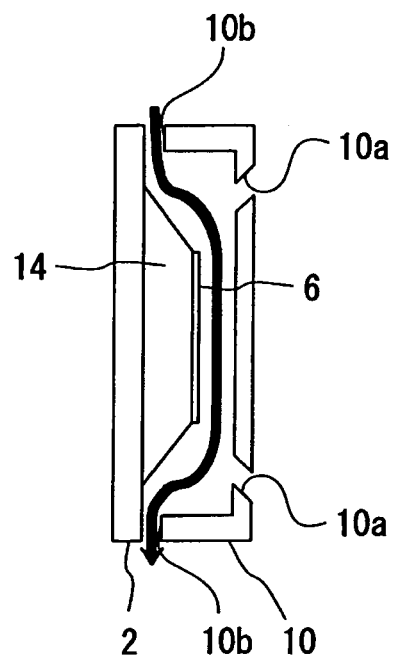
FIG. 10B is another view used to describe the action in relation to FIG. 9.
Figure 10C:
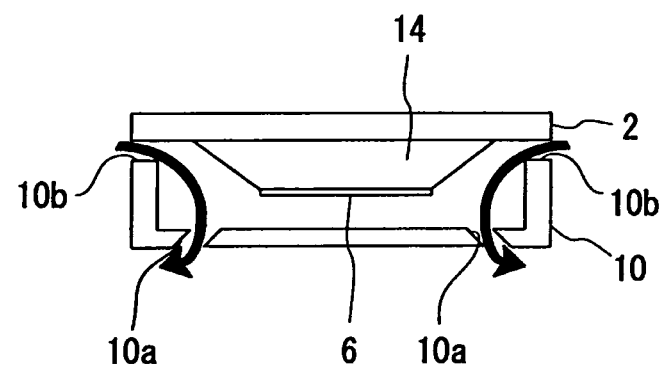
FIG. 10C is still another view used to describe the action in relation to FIG. 9.

In some cases, the vent member 1 is used in a posture in which the cover part 10 is oriented sideways (FIG. 10B) or in a posture in which it is oriented vertically downward (FIG. 10C). Nevertheless, because the cover part 10 is provided with the ventilation holes 10a and the notches 10b, should water enter the interior of the cover part 10, it is possible to discharge the water quickly through the ventilation holes 10a and/or the notches 10b by gravity and/or inertial force induced by acceleration and deceleration of an automobile. In addition, because the ventilation holes 10a and the notches 10b are formed at plural points, the satisfactory water discharging capability as described above can be achieved without having to fine-tune the posture about the center axis line O. In short, the vent member 1 can be attached to the housing 7 by a simple operation.

Second Embodiment

Figure 11:
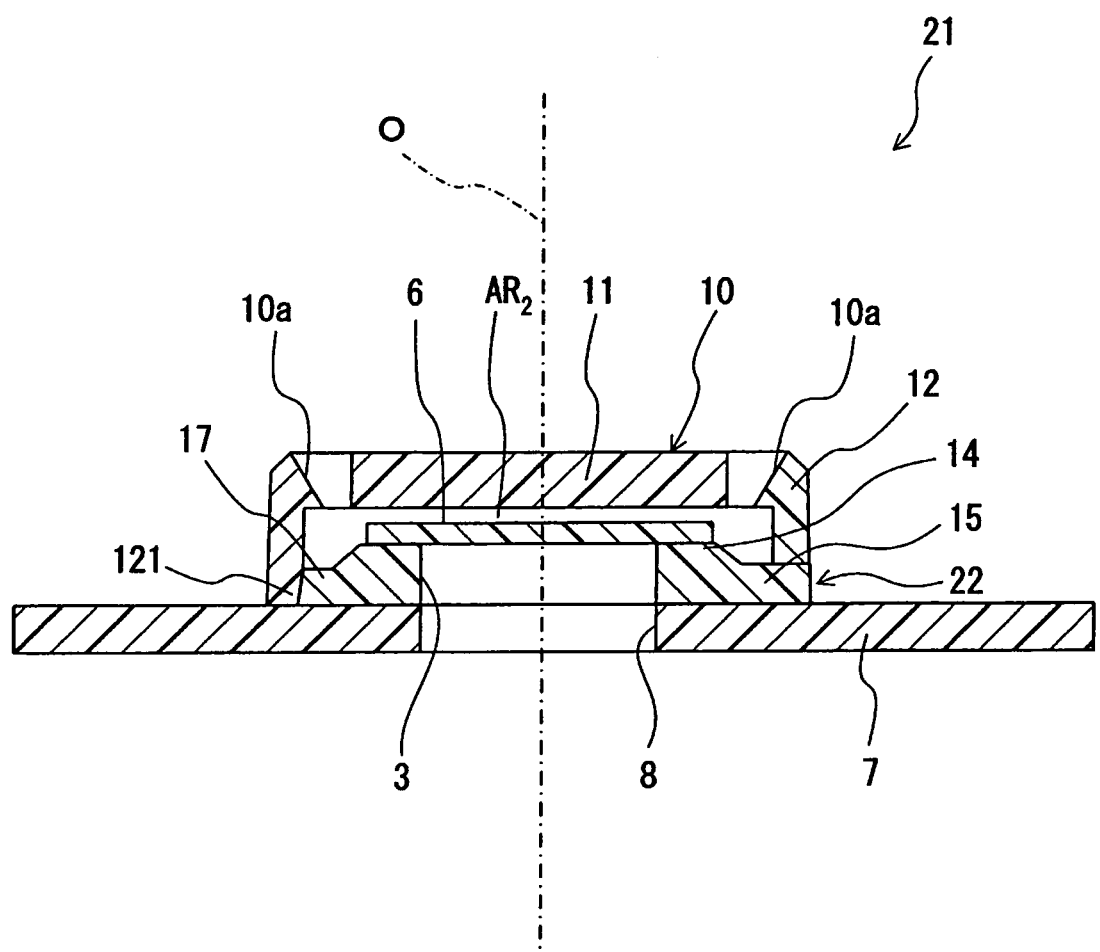
FIG. 11 is a cross section of a vent member according to a second embodiment.

A vent member 21 shown in FIG. 11 is the same as the vent member 1 described above except that the leg portions 161 and 162 are omitted. The vent member 21 is used in a state where the base portion 15 of a support body 22 is joined directly to the opening 8 of the housing 7 with an adhesive. Although this configuration raises a need to join the components with an adhesive, it is possible to ensure higher air tightness because a problem, such as deterioration of a seal ring, is eliminated. Alternatively, the housing 7 and the vent member 21 may be made into one piece by a known insert molding method by disposing the vent member 21 inside a forming mold used to shape the housing 7. Because the vent member 21 as described above does not use a seal ring, it is possible to reduce an amount of protrusion from the surface of the housing 7 by a comparable amount.

Third Embodiment

Figure 12:
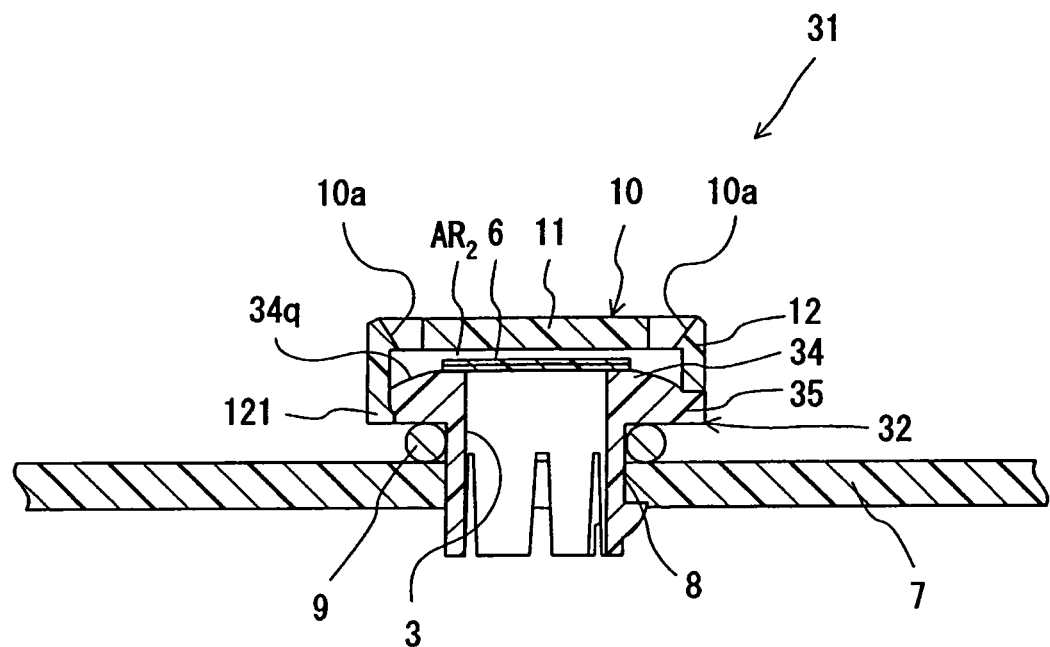
FIG. 12 is a cross section of a vent member according to a third embodiment.

Advantages similar to those achieved by the vent member 1 shown in FIG. 1 and the other relevant drawings also can be achieved by a vent member 31 shown in FIG. 12. The vent member 31 shown in FIG. 12 includes a mesa-like portion 34 having a surface 34q, which is a curved surface, and a support body 32 including a base portion 35 positioned on the lower side of the mesa-like portion 34. When the permeable membrane 6 is fixed to the mesa-like portion 34 of the support body 32, the surface of the permeable membrane 6 is changed to a slightly curved shape by following the mesa-like portion 34. Accordingly, water hardly remains on the permeable membrane 6 whose surface is thus curved.

Industrial Applicability

The vent members 1, 21, and 31 are suitable for the housings of electrical components for automobile, such as head lamps, rear lamps, fog lamps, turn lamps, back lamps, motor cases, pressure sensors, pressure switches, and ECUs. It is possible to achieve significant advantages by attaching the vent members 1, 21, and 31 to the housings of electrical components for automobile, in particular, lamps and ECUs that are exposed directly to the weather and undergo streams of water during car washing. Also, besides the electrical components for automobile, the vent members 1, 21, and 31 can be adopted suitably as housings of electric products, such as mobile communication devices, cameras, electric shavers, and electric toothbrushes.

The invention claimed is:

1. A vent member to be attached to a housing that needs ventilation, comprising:

a support body having a through-hole to serve as a passage for ventilation between an interior and an exterior of the housing;

a permeable membrane disposed on the support body so as to close one of openings of the through-hole; and a cover part covering the support body from a side where the permeable membrane is disposed, wherein, assuming that a direction parallel to a thickness direction of the permeable membrane is an axial direction and an exterior side of the housing and an interior side of the housing with respect to the axial direction are an upper side and a lower side, respectively, then:

the support body includes a mesa-like portion that is convex to the upper side in the axial direction and the through-hole opens in the mesa-like portion for the permeable membrane disposed thereon;

the cover part includes a ceiling portion facing the permeable membrane and a side wall portion extending from a periphery of the ceiling portion to the lower side in the axial direction;

the ceiling portion is provided with a ventilation hole that brings an interior and an exterior of the cover part into communication with each other while establishing a positional relationship in which the ventilation hole does not overlap a permeable region of the permeable membrane with respect to the axial direction;

the side wall portion extends to the lower side in the axial direction below a position at which the permeable membrane is disposed, so that a clearance bringing the interior and the exterior of the cover part into communication with each other is secured between the side wall portion and the support body;

the permeable membrane is protected entirely along a circumferential direction by the side wall portion;

the permeable membrane has a portion that overlaps the through-hole;

the permeable region is defined as the portion that overlaps the through-hole; and the ventilation hole is positioned such that there is no straight line that can pass through the permeable region, and also pass through the ventilation hole.

2. The vent member according to claim 1, wherein:
the mesa-like portion of the support body has a top face perpendicular to the axial direction and a side face inclined with respect to both the axial direction and the top face, and the permeable membrane is fixed to the top face.

3. The vent member according to claim 1, wherein:
the support body and the cover part are of sizes in which outlines appearing when projected in the axial direction almost coincide with each other.

4. The vent member according to claim 1, wherein:
the side wall portion is provided with notches that are concave from the lower side to the upper side in the axial direction at plural points along the circumferential direction, and the clearance that brings the interior and the exterior of the cover part into communication with each other is defined by the notches.

5. The vent member according to claim 4, wherein:
a height (H1) of the clearance defined by the notches with respect to the axial direction is set smaller than a protruding height (H2) of the mesa-like portion.

6. The vent member according to claim 1, wherein;
the side wall portion extends to the lower side in the axial direction below the lowest portion of the permeable membrane; and the side wall portion is provided with notches that are concave from the lower side to the upper side in the axial direction at plural points along the circumferential direction, and the clearance that brings the interior and the exterior of the cover part into communication with each other is defined by the notches.

* * * * *